(12) United States Patent
Yan

(10) Patent No.: US 11,082,053 B1
(45) Date of Patent: Aug. 3, 2021

(54) PHASE LOCKED LOOP-BASED POWER SUPPLY CIRCUIT AND METHOD, AND CHIP

(71) Applicant: MONTAGE TECHNOLOGY, INC., San Jose, CA (US)

(72) Inventor: Gang Yan, San Jose, CA (US)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 17/090,404

(22) Filed: Nov. 5, 2020

(51) Int. Cl.
*H03L 7/093* (2006.01)
*H03L 7/099* (2006.01)
*H03L 7/187* (2006.01)

(52) U.S. Cl.
CPC ............ *H03L 7/0995* (2013.01); *H03L 7/093* (2013.01); *H03L 7/187* (2013.01)

(58) Field of Classification Search
CPC ........ H03L 7/093; H03L 7/0995; H03L 7/187
See application file for complete search history.

(56) References Cited

U.S. PATENT DOCUMENTS

2008/0231352 A1* 9/2008 Kurd .................. H03L 7/08
327/544

* cited by examiner

*Primary Examiner* — Patrick O Neill
(74) *Attorney, Agent, or Firm* — Global IP Services; Tianhua Gu

(57) ABSTRACT

The present disclosure provides a phase locked loop-based power supply circuit and method, and a chip. The phase locked loop-based power supply circuit includes: a phase locked loop circuit, including a voltage-controlled oscillator (VCO), the phase locked loop circuit outputs, through an output end of the phase locked loop circuit, a control voltage for controlling the VCO; and a voltage regulator, an input end of the voltage regulator is connected with the output end of the phase locked loop circuit, to make the control voltage outputted by the phase locked loop circuit form a power supply voltage after passing through the voltage regulator; the power supply voltage is used for supplying power for a load circuit; the load circuit includes at least one logic gate. The phase locked loop-based power supply circuit reduces timing variations in a digital circuit, and is conducive to implementing timing closure.

14 Claims, 9 Drawing Sheets

PHASE LOCKED LOOP-BASED POWER SUPPLY CIRCUIT AND METHOD, AND CHIP

TECHNICAL FIELD

The present disclosure relates to an integrated circuit, and particularly to a phase locked loop-based power supply circuit and method, and a chip.

BACKGROUND

A digital circuit or a digital integrated circuit is a complex circuit including a plurality of logic gates. Compared with an analog circuit, a digital circuit mainly processes digital signals (that is, signals represented by two states, namely, 0 and 1), and therefore, the digital circuit has a strong anti-interference capability. Different from an analog circuit, many synchronous digital circuits have requirements on timing closure. However, in practical applications, the inventor found that digital circuits are susceptible to interference factors during the application process, which results in timing variations. The interference factors are, for example, temperature variations, voltage variations, and process corner differences in the circuit. Such timing variations are often difficult to control and are not conducive to implementing timing closure of a digital circuit.

SUMMARY

The present disclosure provides a phase locked loop-based power supply circuit and method, and a chip, to resolve a problem of difficulty in implementing timing closure of a digital circuit in the traditional technology.

A first aspect of the present disclosure provides a phase locked loop-based power supply circuit, including: a phase locked loop circuit, which includes a voltage-controlled oscillator (VCO), and the phase locked loop circuit outputs, through an output end of the phase locked loop circuit, a control voltage used for controlling the VCO; and a voltage regulator, an input end of the voltage regulator is connected with the output end of the phase locked loop circuit, such that the control voltage outputted by the phase locked loop circuit forms a power supply voltage after passing through the voltage regulator; the power supply voltage is used for supplying power for a load circuit, and the load circuit includes at least one logic gate.

In an embodiment of the first aspect, the VCO is a ring oscillator.

In an embodiment of the first aspect, the ring oscillator includes a loop circuit; and a quantity of inverters in the loop circuit is greater than a threshold.

In an embodiment of the first aspect, the phase locked loop-based power supply circuit further includes a low-pass filter; and the output end of the phase locked loop circuit is connected with the input end of the voltage regulator through the low-pass filter.

In an embodiment of the first aspect, the phase locked loop-based power supply circuit further includes a voltage conditioning circuit; the output end of the phase locked loop circuit is connected with the input end of the voltage regulator through the voltage conditioning circuit; the voltage conditioning circuit is configured to adjust the control voltage outputted by the phase locked loop circuit, to fit for the power supply voltage with the load circuit.

In an embodiment of the first aspect, the voltage conditioning circuit includes an offset circuit, a scaling circuit, and/or a limiting circuit.

A second aspect of the present disclosure provides a chip, including the phase locked loop-based power supply circuit according to the first aspect.

A third aspect of the present disclosure provides a phase locked loop-based power supply method. The phase locked loop-based power supply method is applied to a power supply circuit including a phase locked loop circuit, and the phase locked loop circuit includes a VCO. The phase locked loop-based power supply method includes: outputting, through an output end of the phase locked loop circuit, a control voltage used for controlling the VCO; and supplying power for a load circuit by using the control voltage outputted by the phase locked loop circuit; the load circuit includes at least one logic gate.

In an embodiment of the fourth aspect, the VCO is a ring oscillator.

In an embodiment of the fourth aspect, the ring oscillator includes a loop circuit; and a quantity of inverters in the loop circuit is greater than a threshold.

In an embodiment of the fourth aspect, an implementation of the supplying power for a load circuit by using the control voltage outputted by the phase locked loop circuit includes: regulating, by using a voltage regulator, the control voltage outputted by the phase locked loop circuit, to obtain a power supply voltage; and supplying power for the load circuit by using the power supply voltage.

In an embodiment of the fourth aspect, an implementation of the supplying power for a load circuit by using the control voltage outputted by the phase locked loop circuit includes: filtering, by using a low-pass filter, the control voltage outputted by the phase locked loop circuit, to obtain a power supply voltage; and supplying power for the load circuit by using the power supply voltage.

In an embodiment of the fourth aspect, an implementation of the supplying power for a load circuit by using the control voltage outputted by the phase locked loop circuit includes: adjusting, by using a voltage conditioning circuit, the control voltage outputted by the phase locked loop circuit, to obtain a power supply voltage matching the load circuit; and supplying power for the load circuit by using the power supply voltage.

In an embodiment of the fourth aspect, the voltage conditioning circuit includes an offset circuit, a scaling circuit, and/or a limiting circuit.

As stated above, the phase locked loop-based power supply circuit includes a phase locked loop circuit and a voltage regulator. The phase locked loop circuit outputs, through an output end of the phase locked loop circuit, a control voltage used to control the VCO. The control voltage forms a power supply voltage after passing through the voltage regulator. The power supply voltage may be used for supplying power for a load circuit. In the phase locked loop circuit, the control voltage of the VCO can be adaptively adjusted according to interference factors in the circuit, to keep a frequency of a clock signal stable. Therefore, the control voltage of the VCO has compensated for the interference factors in the circuit. Further, it can be learned that supplying power for the load circuit by using the power supply voltage that is formed by the control voltage after the control voltage passes through the voltage regulator can reduce or even eliminate the impact of interference factors on a timing variation of the load circuit, and is conducive to implementing timing closure of a digital circuit.

REFERENCE NUMERALS

Figure 1:
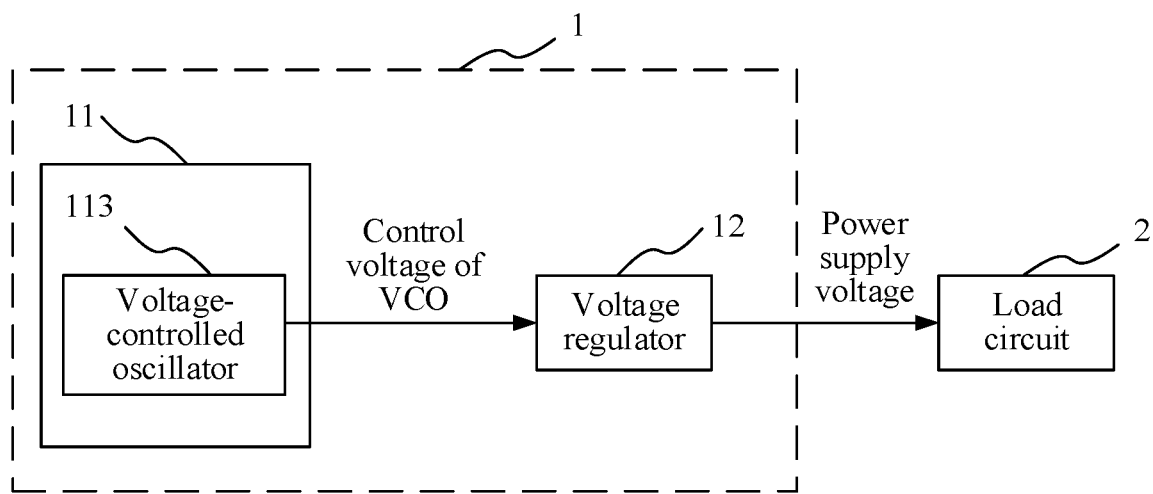
FIG. 1 is a schematic structural diagram of a phase locked loop-based power supply circuit in a specific embodiment of the present disclosure.

1 Phase locked loop-based power supply circuit
11 Phase locked loop circuit
111 Phase discriminator
112 Loop filter
113 Voltage-controlled oscillator
114 Charge pump
115 Frequency divider
12 Voltage regulator
13 Low-pass filter
14 Voltage conditioning circuit
2 Load circuit
S11 to S12 Operations
S121a to S122a Operations
S121b to S122b Operations
S121c to S122c Operations
S21 to S25 Operations

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. It needs to be stated that the following embodiments and the features in the embodiments can be combined under the situation of no conflict. It needs to be stated that the drawings provided in the following embodiments are just used for schematically describing the basic concept of the present disclosure, thus only illustrating components only related to the present disclosure and are not drawn according to the numbers, shapes, and sizes of components during actual implementation, the configuration, number and scale of each component during the actual implementation thereof may be freely changed, and the component layout configuration thereof may be more complicated. Besides, the relational terms herein, such as "first" and "second", are used only to differentiate an entity or operation from another entity or operation, and do not require or imply any actual relationship or sequence between these entities or operations.

A digital circuit usually includes many logic gates. The components of the logic gate, for example, complementary metal oxide semiconductor (CMOS) devices, are susceptible to interference factors and thus each has a delay to different extents. Such delay may cause timing variations in the digital circuit. For example, a circuit that should be theoretically synchronous may lose its synchronicity because of the existence of such delay. The interference factors are, for example, temperature variations, voltage variations, and/or a process corner differences in the circuit. For a digital circuit, such timing variations are usually caused by a plurality of logic gates, and may occur at any circumstance. Therefore, the timing variations are usually difficult to control. Moreover, such timing variations significantly worsen the timing closure of the digital circuit. The timing closure refers to a process of adjusting or modifying a circuit to enable the circuit to satisfy timing requirements.

For such a problem, the present disclosure provides a phase locked loop-based power supply circuit, including a phase locked loop circuit and a voltage regulator. The phase locked loop circuit outputs, through an output end of the phase locked loop circuit, a control voltage used for controlling the VCO. The control voltage forms a power supply voltage after passing through the voltage regulator. The power supply voltage may be used for supplying power for a load circuit. In the phase locked loop circuit, the control voltage of the VCO may be adaptively adjusted according to interference factors in the circuit, to keep the frequency of a clock signal stable. Therefore, the control voltage of the VCO has compensated for the interference factors in the circuit. Further, it can be learned that, by using the power supply voltage that is formed after the control voltage passing through the voltage regulator to supply power for the load circuit, the impact of interference factors on timing variations of the load circuit can be reduced or even eliminated, which is conducive to implementing timing closure of a digital circuit.

Referring to FIG. 1, in an embodiment of the present disclosure, the phase locked loop-based power supply circuit 1 includes a phase locked loop circuit 11 and a voltage regulator 12.

The phase locked loop circuit 11 includes a VCO (Voltage-Controlled Oscillator) 113. The phase locked loop circuit 11 outputs, through an output end of the phase locked loop circuit 11, a control voltage used for controlling the VCO 113. The VCO 113 refers to an oscillator circuit whose output frequency has a corresponding relationship with the inputted control voltage.

The phase locked loop circuit 11 is a negative feedback control system that tunes the VCO by using a voltage generated through phase synchronization to generate a target frequency, and can implement automatic tracing of its input signal frequency by its output signal frequency. In this embodiment, the phase locked loop circuit 11 is configured to generate a control voltage that can be automatically adjusted to compensate for the interference factors.

Specifically, the phase locked loop circuit 11 includes one or more logic gate circuits. The logic gate circuit may be affected by interference factors and generate a delay. Such delay causes the output frequency of the phase locked loop circuit 11 to vary. Based on a negative feedback mechanism of the phase locked loop circuit 11, the phase locked loop circuit 11 adjusts the control voltage of the VCO, to ensure that the output frequency of the phase locked loop circuit 11 keeps stable. Therefore, the control voltage of the VCO can compensate for the impact by the interference factors.

An input end of the voltage regulator 12 is connected with the output end of the phase locked loop circuit 11, to make the control voltage outputted by the phase locked loop circuit 11 form a power supply voltage after passing through the voltage regulator 12. The voltage regulator 12 is configured to stabilize the control voltage of the VCO, to further obtain a low-impedance power supply voltage. The output end of the phase locked loop circuit 11 may be connected to the input end of the voltage regulator 12 directly, or may be connected with the voltage regulator 12 indirectly through another circuit. The power supply voltage is used for supplying power for a load circuit 2, and the load circuit 2 includes at least one logic gate. The voltage regulator 12 may be an on-chip voltage regulator or an off-chip voltage regulator. The on-chip voltage regulator refers to a voltage regulator located on a chip, is applicable to a chip that is relatively small. The off-chip voltage regulator may be a voltage regulator outside a chip and is applicable to an integrated circuit that is relatively large.

In a specific application, the load circuit 2 has interference factors the same as or similar to that of the phase locked loop circuit 11. For example, logic gate devices included in both of a load circuit 2 and a phase locked loop circuit 11 that are on the same chip usually have temperatures, voltages, and process corners that are the same as or similar to each other. Therefore, impact of the interference factors on the logic gate in the load circuit 2 is the same as or similar to that in the phase locked loop circuit 11. Given the above, the power supply voltage formed from the control voltage of the VCO that has compensated for the interference factors after the control voltage of the VCO passes through the voltage regulator 12 can also compensate for impact of the interference factors on the load circuit 2.

It can be learned according to the foregoing description that in the phase locked loop-based power supply circuit 1 according to this embodiment, the phase locked loop circuit 11 outputs, through the output end of the phase locked loop circuit 11, the control voltage used for controlling the VCO. The control voltage forms the power supply voltage after passing through the voltage regulator 12. The power supply voltage may be used for supplying power for the load circuit 2. In the phase locked loop circuit 11, the control voltage of the VCO may be adaptively adjusted according to interference factors in the circuit, to keep the frequency of a clock signal stable. Therefore, the control voltage of the VCO has compensated for the interference factors in the circuit. Further, it can be learned that supplying power for the load circuit by using the power supply voltage that is formed by the control voltage after the control voltage passes through the voltage regulator can reduce or even eliminate the impact of interference factors on a timing variation of the load circuit, and is conducive to implementing timing closure of a digital circuit.

Besides, in the conventional technology, to ensure timing closure of the digital circuit, a power supply voltage of the digital circuit is usually increased to ensure that the digital circuit can still satisfy timing in worst running status. That is, in these embodiments, the digital circuit is over-designed to ensure its timing closure. However, in most cases, the digital circuit is not in the worst running status. Therefore, in many cases, it is unnecessary to provide excessive-high power supply voltage for the digital circuit which may cause an increase of power consumption. However, in this embodiment, power is supplied for the load circuit by using the power supply voltage that is formed from the control voltage of the VCO after voltage regulation, and the power supply voltage can vary with a variation of the interference factors in the circuit. Therefore, it is unnecessary to supply power always at a high power supply voltage, which is conducive to reducing power consumption of the digital circuit.

Figure 2A:
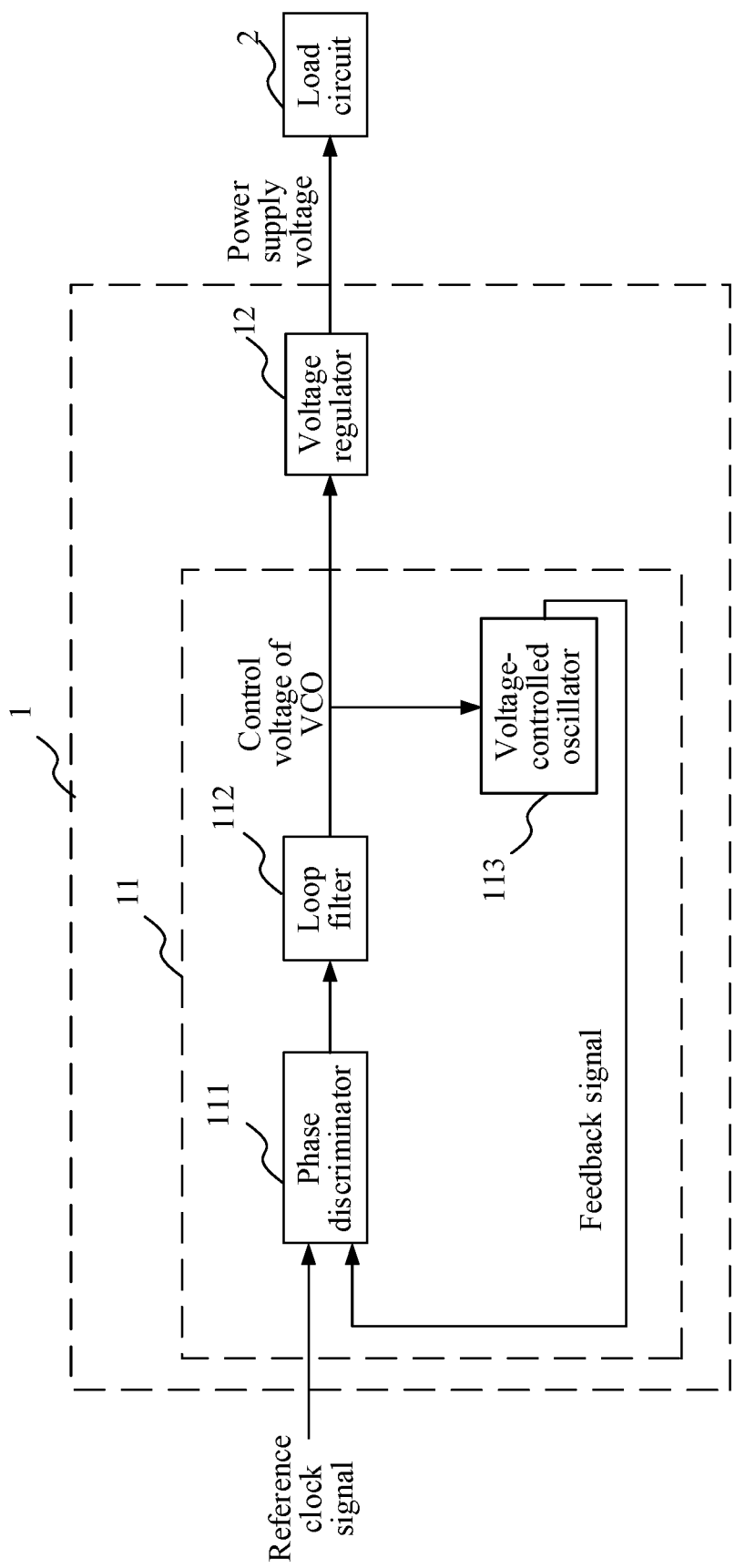
FIG. 2A is a schematic structural diagram of a phase locked loop-based power supply circuit in a specific embodiment of the present disclosure.

Referring to FIG. 2A, in an embodiment of the present disclosure, the phase locked loop circuit 11 includes a phase discriminator 111, a loop filter 112, and a VCO 113. The phase discriminator 111 is configured to detect a phase difference between a reference clock signal and a feedback signal, and generate a pulse-width modulated signal proportional to the phase difference. The loop filter 112 has a low-pass characteristic, and is configured to filter out a high-frequency component of the pulse-width modulated signal to extract a direct-current component thereof, so that a control voltage of the VCO 113 maybe obtained according to the direct-current component. Under the effect of the feedback signal and the reference clock signal, the VCO 113 may continuously tune an oscillation frequency of the clock signal, and finally, keep the oscillation frequency dynamically stable. In this embodiment, a signal outputted by the VCO 113 has a frequency the same as that of the reference clock signal.

For the phase locked loop circuit 11 that is in a stable state, assuming that the logic gate in the phase locked loop circuit 11 generates timing variations under the effect of the interference factors at a specific moment, for example, the interference factors increase delay of the logic gates in the phase locked loop circuit 11, in this case, the frequency of the signal outputted by the VCO 113 decreases, which may cause the phase difference between the signal and the reference clock signal. When the signal is inputted into the phase discriminator 111 as a feedback signal, the phase discriminator 111 outputs the pulse-width modulated signal proportional to the phase difference. Under the effect of the pulse-width modulated signal, the control voltage of the VCO 113 is gradually increased, so that the frequency of the signal outputted by the VCO 113 is finally the same as that of the reference clock signal, and the phase locked loop circuit 11 reaches the stable state again. Given the above, the control voltage of the VCO 113 can automatically compensate for the impact of the interference factors on the timing of the phase locked loop circuit 11.

Figure 2B:
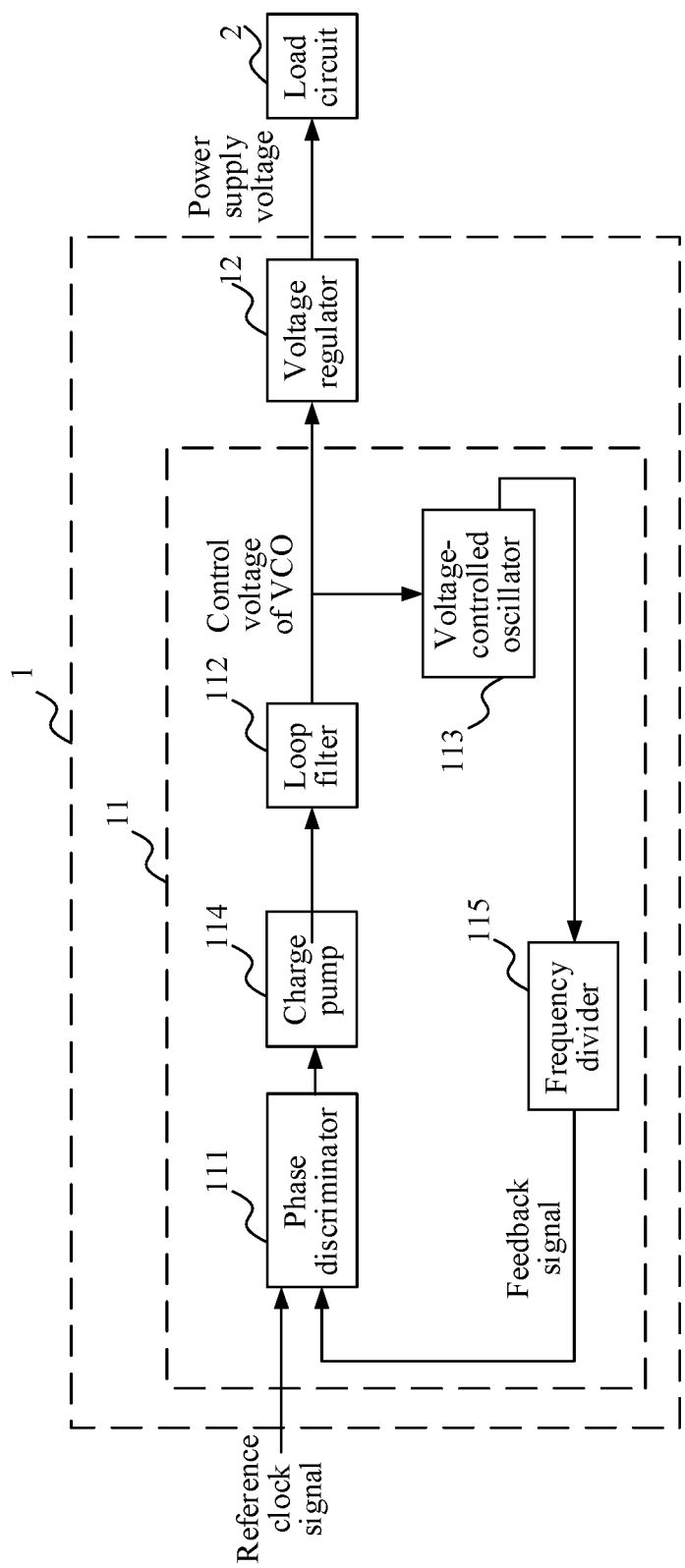
FIG. 2B is a schematic structural diagram of a phase locked loop-based power supply circuit in a specific embodiment of the present disclosure.

Referring to FIG. 2B, in an embodiment of the present disclosure, the phase locked loop circuit 11 may include a phase discriminator 111, a charge pump 114, a loop filter 112, a VCO 113, and a frequency divider 115. The phase discriminator 111 is configured to detect a phase difference between a reference clock signal and a feedback signal, and generate a pulse-width modulated signal proportional to the phase difference. The charge pump 114 is configured to convert the pulse-width modulated signal into a voltage signal; after the voltage signal passes through the loop filter 112, a control voltage of the VCO 113 is generated. Under the control of the control voltage, the VCO 113 outputs a clock signal, and the clock signal forms a feedback signal after passing through the frequency divider 115. Under the effect of the feedback signal and the reference clock signal, the VCO 113 continuously tunes an oscillation frequency of the clock signal, and finally, keeps the oscillation frequency dynamically stable. In this embodiment, a frequency of the clock signal outputted by the VCO 113 is an integer multiple of a frequency of the reference clock signal. Also, in this embodiment, the control voltage of the VCO 113 can automatically compensate for the impact of the interference factors on the timing of the phase locked loop circuit 11. A specific compensation process is similar to that of the phase locked loop circuit 11 shown in FIG. 2A, and details are not described herein again.

Figure 3A:
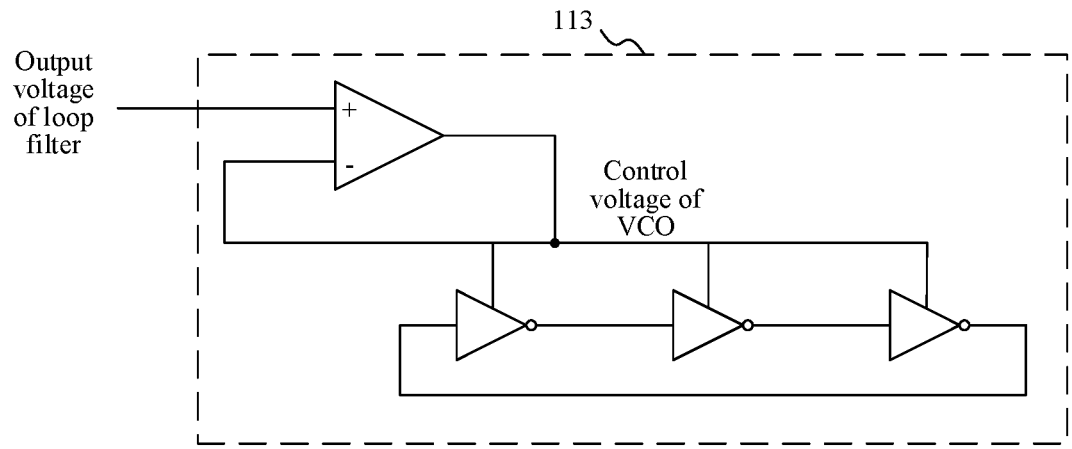
FIG. 3A is a circuit diagram of a ring oscillator of a phase locked loop-based power supply circuit in a specific embodiment of the present disclosure.
Figure 3B:
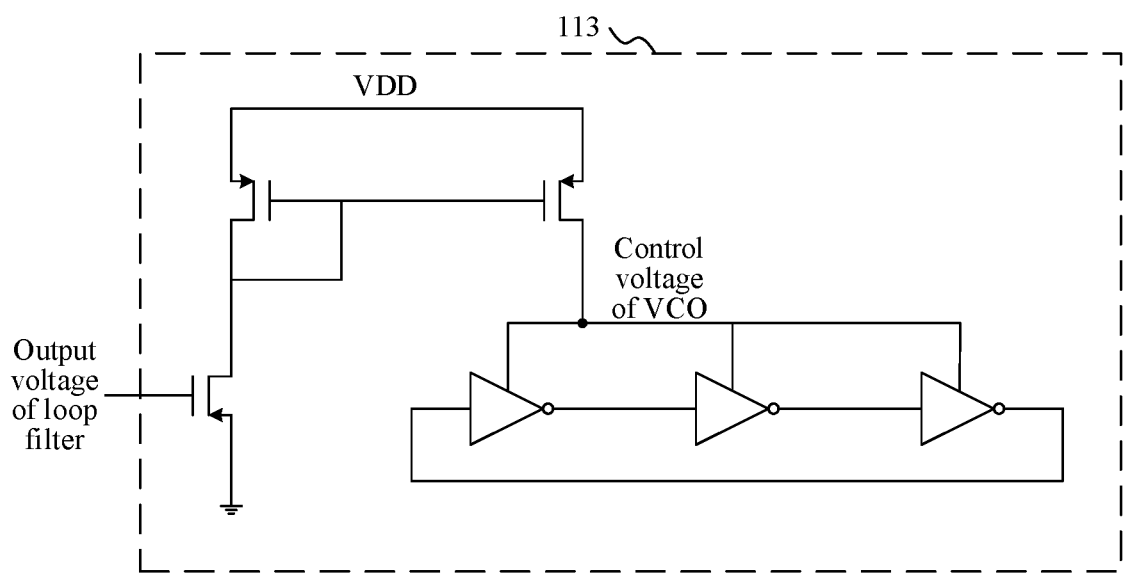
FIG. 3B is a circuit diagram of a ring oscillator of a phase locked loop-based power supply circuit in a specific embodiment of the present disclosure.

In an embodiment of the present disclosure, the VCO 113 is a ring oscillator. Referring to FIG. 3A and FIG. 3B, the ring oscillator includes a loop circuit, and the loop circuit is formed by connecting an odd number of NOT gates end to end. A quantity of the NOT gates included in the loop circuit is referred to as the number of stages of ring oscillator. The NOT gate in the loop circuit may be a CMOS inverter. In this embodiment, FIG. 3A shows an example of using a voltage to directly supply power for the loop circuit in the ring oscillator, and FIG. 3B shows an example of converting a current into a voltage to further indirectly supply power for the loop circuit in the ring oscillator. Regardless of direct power supply or indirect power supply, the control voltage of the VCO can compensate for the impact of the interference factors on the phase locked loop circuit 11.

In this embodiment, a ring oscillator is used as the VCO 113, so that the structure of the phase locked loop circuit is simplified, the tuning range of the VCO is broadened, and the compatibility of the VCO with digital processing is improved.

Specifically, when the loop circuit in the ring oscillator is formed by using a CMOS inverter, and the CMOS inverter is a type of logic gate, the delay of the CMOS inverter reflects its voltage, its temperature, and its process corner. Since the voltage, the temperature, and the process corner of the logic gate in the load circuit 2 are the same as or similar to those of the CMOS inverter, the logic gate in the load circuit 2 has a delay the same as or similar to that of the CMOS inverter. When the phase locked loop circuit 11 forces the cycle of the ring oscillator to be the same as the cycle of the target clock by adjusting the control voltage of the ring oscillator, if the control voltage is supplied to another logic gate in the load circuit, the delay of another logic gate is proportional to the cycle of the target clock. Therefore, in this embodiment, provided that each stage in the ring oscillator is a CMOS inverter or a device similar to a CMOS logic gate, the delay of the logic gate in the load circuit can track—the cycle of the ring oscillator.

In addition, in this embodiment, the number of stages of the ring oscillator would affect the waveform of the control voltage. Specifically, a smaller number of stages of the ring oscillator may indicate that the oscillation waveform is closer to a ramp. The ramp is, for example, a sine wave or a triangular wave. A larger number of stages of the ring oscillator may indicate that the oscillation waveform is closer to a square wave. For the phase locked loop-based power supply circuit, a larger number of stages the ring oscillator may indicate a stronger compensation capacity for the interference factors, and therefore, it is more likely to implement timing closure of the digital circuit. The delay variation factor may be described by a ratio of a maximum delay to a minimum delay of the same load circuit under different conditions. The maximum delay corresponds to the slowest condition of the load circuit, for example, a high-temperature and slow process corner. The minimum delay corresponds to the fastest condition of the load circuit, for example, a low-temperature and fast process corner. The smaller the delay variation factor, the better it is for the timing closure. In this embodiment, the delay variation factor can be as small as 1.1 (in contrast, the delay variation factor is 2 when the impact of interference factors is not compensated), while different types of the ring oscillators can have approximately 1% to 2% difference on the delay variation factor.

Preferably, in the loop circuit according to this embodiment, the number of inverters is greater than a threshold, and the threshold may be determined according to actual requirements. When the load circuit has a relatively high requirement on timing closure, a relatively large threshold, for example, 11 or 13, may be selected. When the load circuit has a relatively low requirement on timing closure, a relatively small threshold, for example, 3 or 5, may be selected.

Figure 4A:
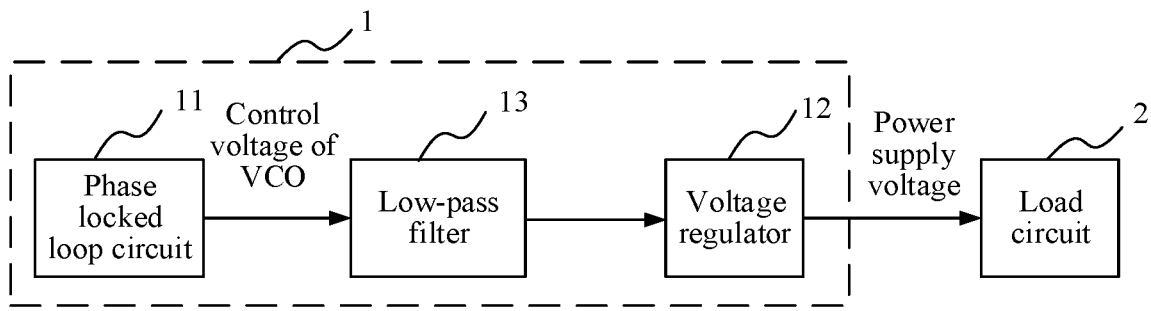
FIG. 4A is a schematic structural diagram of a phase locked loop-based power supply circuit in a specific embodiment of the present disclosure.
Figure 4B:
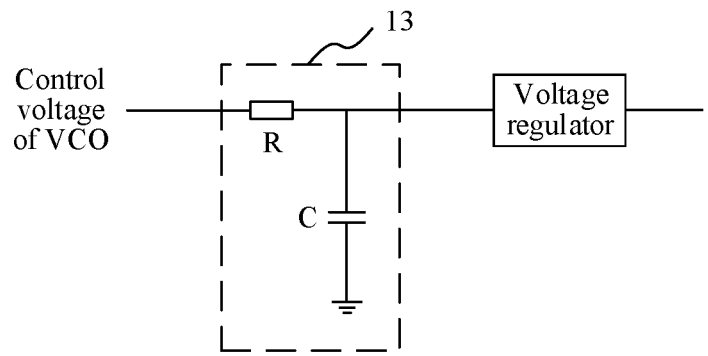
FIG. 4B is a circuit diagram of a low-pass filter of a phase locked loop-based power supply circuit in a specific embodiment of the present disclosure.

It should be noted that the ring oscillator may have any number of stages. Preferably, the number of stages of the ring oscillator may be a half or slightly more than a half of a critical timing path. Specifically, the cycle of the ring oscillator includes a rising edge delay and a falling edge delay. Therefore, each stage of the ring oscillator corresponds to two delays (the rising edge delay and the falling edge delay). Based on the above, it can be learned that when the number of stages of the ring oscillator is a half or slightly more than a half of the critical timing path, the delay of the ring oscillator is basically the same as the delay of the critical timing path. Therefore, the best matching is provided. The critical timing path (or referred to as a critical path) is the longest path in timing paths. For example, in the digital circuit, there are a plurality of logic paths from an output end of a specific flip-flop to an input end of another flip-flop, among which the longest logic path is the critical timing path between the two flip-flops. When the logic delay of the digital circuit is optimized, all critical paths in the digital circuit meet the timing requirement, and the entire digital circuit converges to a timing closure. Referring to FIG. 4A, in an embodiment of the present disclosure, in consideration of the ripple in the control voltage of the VCO, the phase locked loop-based power supply circuit 1 according to this embodiment further includes a low-pass filter 13. The output end of the phase locked loop circuit 11 is connected with the input end of the voltage regulator 12 through the low-pass filter 13, and is configured to filter out high-frequency noise in the control voltage of the VCO. FIG. 4B shows a first-order passive RC low-pass filter applicable to the present disclosure. However, the low-pass filter applicable to the present disclosure is not limited thereto. The low-pass filter may be an any-order, active, or passive filter.

In this embodiment, the phase locked loop-based power supply circuit includes a low-pass filter. The low-pass filter can filter out high-frequency noise in the control voltage of the VCO, thereby further enabling the phase locked loop-based power supply circuit to supply power for the load circuit better without introducing additional high-frequency noise.

Figure 5:
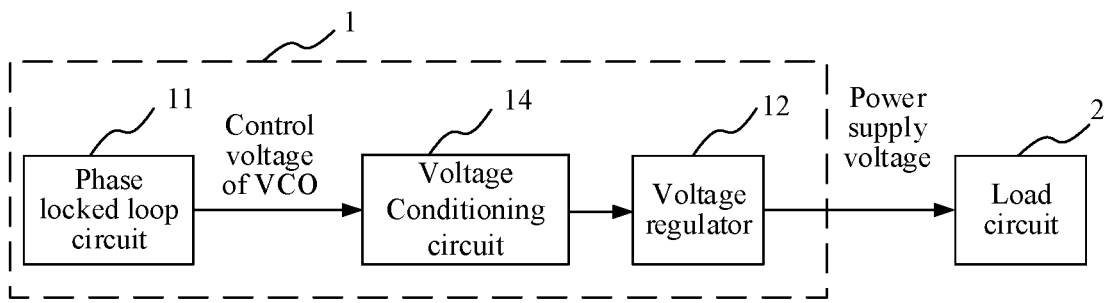
FIG. 5 is a schematic structural diagram of a phase locked loop-based power supply circuit in a specific embodiment of the present disclosure.

In a specific application, if the working frequency of a circuit is relatively low, the power supply voltage is excessively low, and consequently, the timing closure of the circuit is affected. For example, if the normal working frequency of a specific chip is 1 GHz, and the power supply voltage of the chip is 1 V, in this case, the digital circuit can implement timing closure at a voltage of 1 V and a frequency of 1 GHz. However, in some cases, the working frequency is reduced to 100 MHz, and the power supply voltage is reduced to 0.4 V. In such an instance, although the power supply voltage and the timing requirements may certainly be reduced simultaneously in a real design, such a power supply voltage, 0.4 V, is relatively rare in a digital design practice, and the mismatch between VCO and the load circuits increases, which may result in a case that the load circuit cannot meet the timing requirement. For such a problem, referring to FIG. 5, in an embodiment of the present disclosure, the phase locked loop-based power supply circuit 1 further includes a voltage conditioning circuit 14. The output end of the phase locked loop circuit 11 is connected with the input end of the voltage regulator 12 through the voltage conditioning circuit 14. Specifically, the voltage conditioning circuit 14 may be an offset circuit, a scaling circuit, and/or a limiting circuit. The offset circuit is a positive offset adder, configured to increase the control voltage of the VCO. The scaling circuit is configured to amplify the control voltage of the VCO. The limiting circuit is configured to limit the control voltage of the VCO to be greater than a specified value. The offset circuit, the scaling circuit, and the limiting circuit may degrade the compensation for the interference factors by the control voltage of the VCO, but can ensure, as much as possible, the circuit to meet the timing requirement. In a specific application, the voltage conditioning circuit may be optimized according to its actual requirement, to reduce the adverse effect of the voltage conditioning circuit on a compensation effect as much as possible while achieving timing closure of the circuit.

It can be learned according to the foregoing description that in this embodiment, the voltage conditioning circuit is configured in the phase locked loop-based power supply circuit, to ensure the timing closure by sacrificing the compensation capacity a little.

It should be noted that in this embodiment, the voltage conditioning circuit may be any one or a combination of the offset circuit, the scaling circuit, and/or the limiting circuit. An extra timing margin may be designed for the digital circuit by using the voltage conditioning circuit, to ensure the timing closure even with the mismatching between the VCO in the phase locked loop-based power supply circuit and the load circuit.

In an embodiment of the present disclosure, each stage in the VCO has a delay similar to that of the logic gate of the load circuit. In the digital circuit, the VCO runs at the highest frequency and provides a master clock for the digital circuit. In addition, in this embodiment, the offset of the voltage regulator may be calibrated out. Specifically, the offset of the voltage regulator may be calibrated out after each time of power-on or may be calibrated out one time before delivery from the factory. For the latter, a calibration code of the voltage regulator may be stored in a non-volatile memory, and is applied after power-on.

Figure 6:
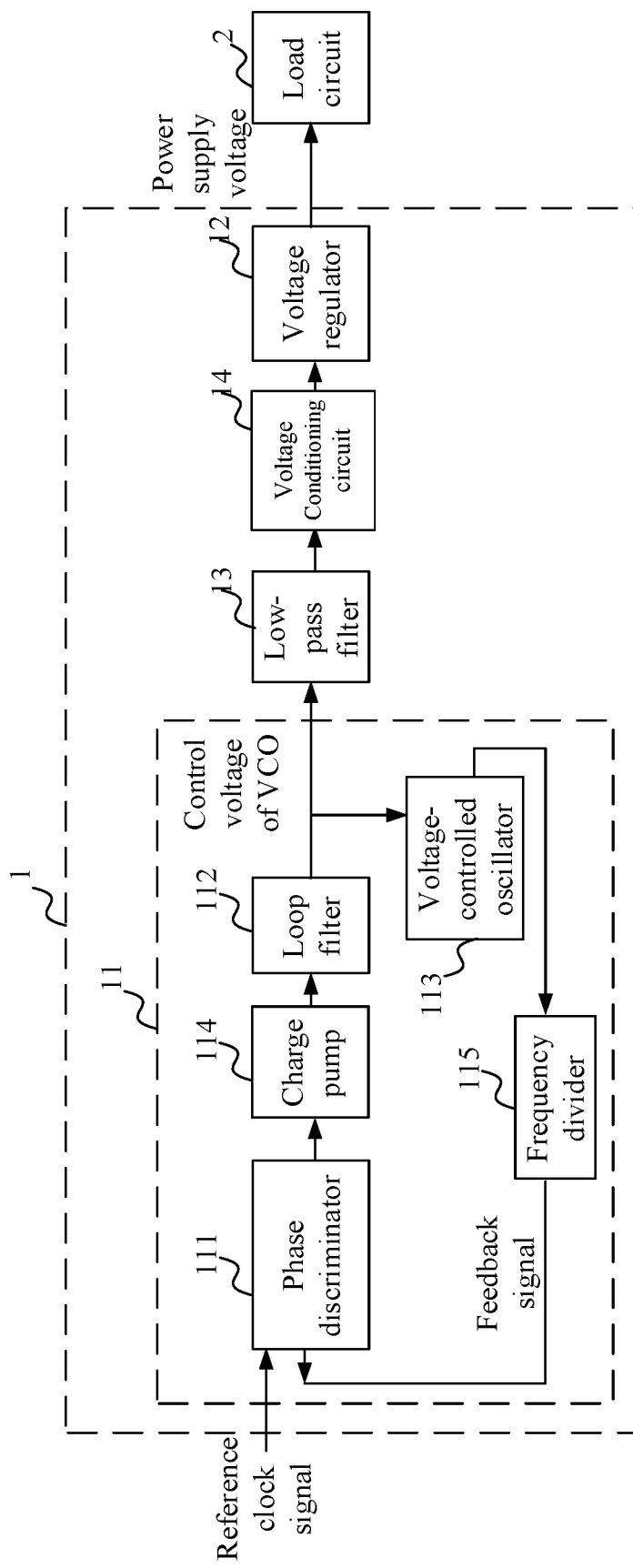
FIG. 6 is a schematic structural diagram of a phase locked loop-based power supply circuit in a specific embodiment of the present disclosure.

Referring to FIG. 6, in an embodiment of the present disclosure, the phase locked loop-based power supply circuit 1 includes a phase locked loop circuit 11, a low-pass filter 13, a voltage conditioning circuit 14, and a voltage regulator 12. The phase locked loop circuit 11 includes a phase discriminator 111, a charge pump 114, a loop filter 112, a VCO 113, and a frequency divider 115.

In the phase locked loop circuit 11, inputs of the phase discriminator 111 are respectively a reference clock signal and a feedback signal outputted by the frequency divider 115. The phase discriminator 111 is configured to detect a phase difference between the reference clock signal and the feedback signal, and generate a pulse-width modulated signal proportional to the phase difference. An output end of the phase discriminator 111 is connected with an input end of the charge pump 114, and the charge pump 114 is configured to convert the pulse-width modulated signal into a voltage signal. An output end of the charge pump 114 is connected with an input end of the loop filter 112, and the loop filter 112 is configured to generate a control voltage of the VCO 113 after filtering the voltage signal outputted by the charge pump 114. An output end of the loop filter 112 corresponds to an output end of the phase locked loop circuit 11, and also corresponds to a control end of the VCO 113. An output end of the VCO 113 is connected with an input end of the frequency divider 115, and the VCO 113 is configured to generate a clock signal at a special frequency according to the control voltage of the VCO. The frequency divider 115 is configured to perform frequency division on the clock signal, to obtain the feedback signal.

The phase locked loop circuit 11 outputs the control voltage of the VCO 113 through the output end of the phase locked loop circuit 11, the control voltage arrives at the input end of the voltage regulator 12 after being subject to low-pass filtering performed by the low-pass filter 13 and adjusted by the voltage conditioning circuit 14. After the voltage regulator 12 performs voltage regulation on the control voltage, a power supply voltage is formed. The power supply voltage may supply power for the load circuit 2. The load circuit 2 includes at least one logic gate.

Preferably, the VCO 113 is a ring oscillator, and the ring oscillator includes a ring circuit formed by a plurality of NOT gates. Further preferably, the oscillator is formed by sequentially connecting an odd number of CMOS inverters end to end.

Figure 7:
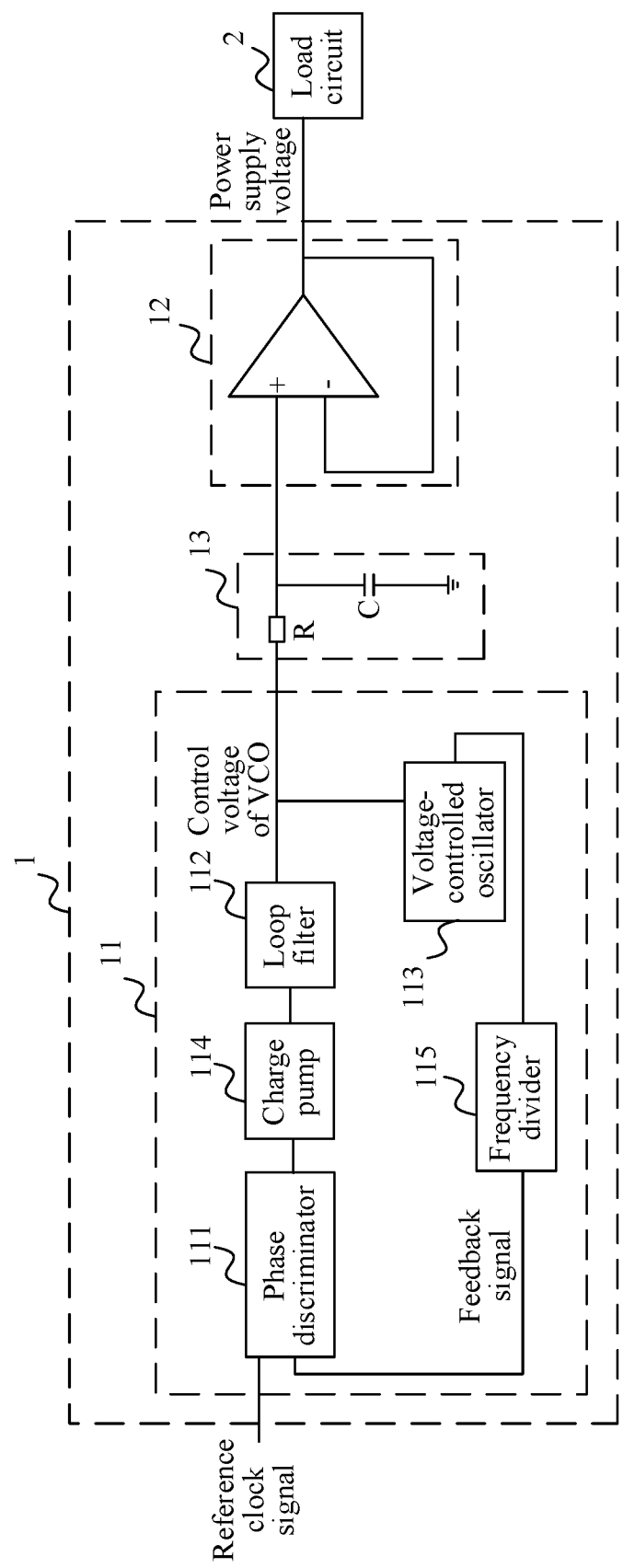
FIG. 7 is a schematic structural diagram of a phase locked loop-based power supply circuit in a specific embodiment of the present disclosure.

Referring to FIG. 7, in a further embodiment of the present disclosure, the phase locked loop-based power supply circuit 1 includes a phase locked loop circuit 11, a low-pass filter 13, and a voltage regulator 12. The phase locked loop circuit 11 includes a phase discriminator 111, a charge pump 114, a loop filter 112, a VCO 113, and a frequency divider 115. The structure and the function of the phase locked loop circuit 11 are similar to those of the phase locked loop circuit shown in FIG. 6, and details are not described herein again.

Figure 8:
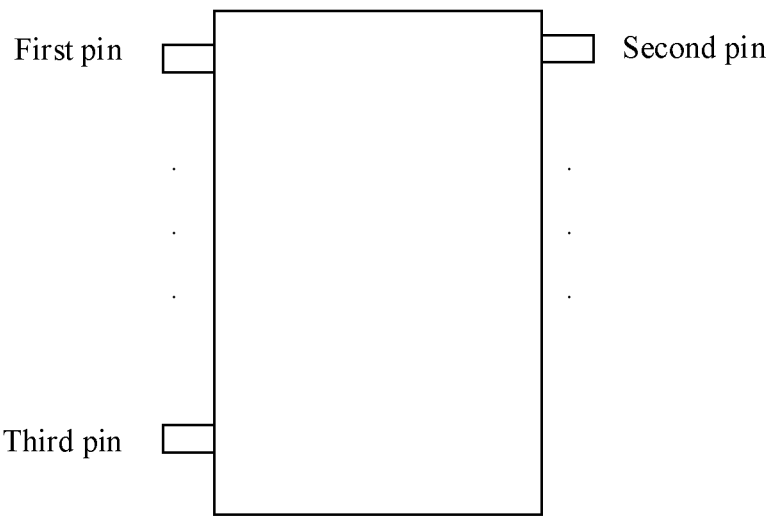
FIG. 8 is a schematic structural diagram of a chip in a specific embodiment of the present disclosure.

Based on the foregoing description on the phase locked loop-based power supply circuit, there is provided a chip. Referring to FIG. 8, the chip includes at least some portions of the phase locked loop-based power supply circuit according to the present disclosure. For example, the chip may include the entire phase locked loop-based power supply circuit, or may include only the phase locked loop circuit in the phase locked loop-based power supply circuit. The chip may be represented as a marketable active device formed by encapsulating a phase locked loop-based power supply circuit manufactured on a wafer by using a semiconductor technology, or may be represented as a marketable active device formed by encapsulating the phase locked loop-based power supply circuit by using a package encapsulation technology.

Based on the foregoing description on the phase locked loop-based power supply circuit, there is provided an electronic device. The electronic device includes the phase locked loop-based power supply circuit according to the present disclosure and includes a load circuit. The load circuit includes at least one logic gate, and is electrically connected with an output end of the phase locked loop-based power supply circuit. The phase locked loop-based power supply circuit supplies power for the load circuit by using a power supply voltage at the output end of the phase locked loop-based power supply circuit.

In an embodiment of the present disclosure, the voltage regulator is an on-chip voltage regulator or an off-chip voltage regulator. The on-chip voltage regulator refers to a voltage regulator located on a chip, is applicable to a chip that is relatively small. The off-chip voltage regulator is a voltage regulator outside a chip and is applicable to an integrated circuit that is relatively large.

Figure 9:
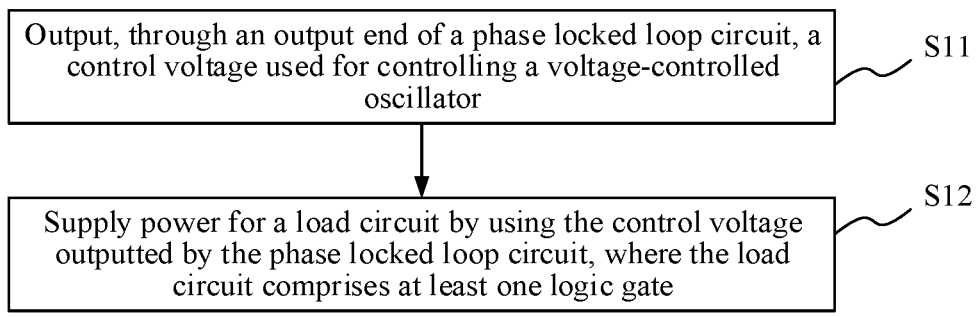
FIG. 9 is a flowchart of a phase locked loop-based power supply method in a specific embodiment of the present disclosure.

Based on the foregoing description on the phase locked loop-based power supply circuit, there is provided a phase locked loop-based power supply method. In an embodiment of the present disclosure, a flowchart of the phase locked loop-based power supply method is shown in FIG. 9. The method may be applied to a power supply circuit including a phase locked loop circuit. For example, the method may be performed by the phase locked loop-based power supply circuit shown in FIG. 1, FIG. 2A, FIG. 2B, FIG. 4A, FIG. 5, FIG. 6, or FIG. 7. Specifically, the phase locked loop-based power supply method includes the following:

S11, outputting, through an output end of the phase locked loop circuit, a control voltage used for controlling a VCO.

S12, supplying power for a load circuit by using the control voltage outputted by the phase locked loop circuit; the load circuit includes at least one logic gate. In this method, by using the control voltage outputted by the phase locked loop circuit to supply power for the load circuit, the impact of interference factors on a timing variation of the load circuit can be reduced or even eliminated, which is conducive to implementing timing closure of a digital circuit.

In an embodiment of the present disclosure, the phase locked loop circuit includes a phase discriminator, a loop filter, and a VCO.

In an embodiment of the present disclosure, the phase locked loop circuit includes a phase discriminator, a charge pump, a loop filter, a VCO, and a frequency divider.

In an embodiment of the present disclosure, the VCO is a ring oscillator. The ring oscillator includes a loop circuit formed by connecting an odd number of NOT gates end to end.

Preferably, in this embodiment, a quantity of inverters in the loop circuit is greater than a threshold. The threshold may be determined according to actual requirements. When the load circuit has a relatively high requirement on timing, a relatively large threshold, for example, 11 or 13, may be selected. When the load circuit has a relatively low requirement on timing, a relatively small threshold, for example, 3 or 5, may be selected.

Figure 10:
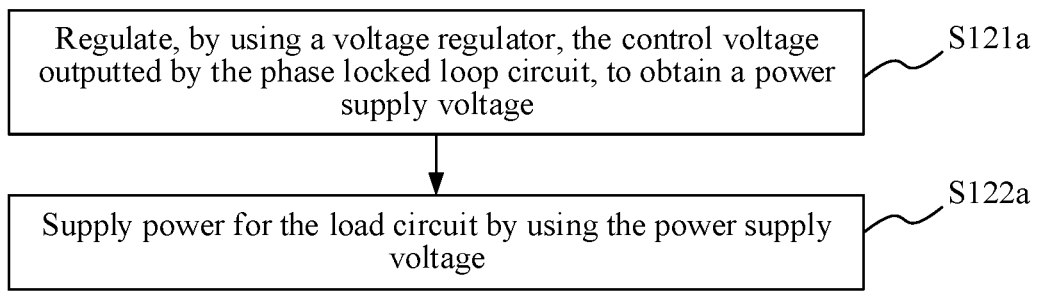
FIG. 10 is a flowchart of operation S12 of a phase locked loop-based power supply method in a specific embodiment of the present disclosure.

Referring to FIG. 10, in an embodiment of the present disclosure, the supplying power for a load circuit by using the control voltage outputted by the phase locked loop circuit includes the following:

S121*a*, regulating, by using a voltage regulator, the control voltage outputted by the phase locked loop circuit, to obtain a power supply voltage.

S122*a*, supplying power for the load circuit by using the power supply voltage.

Figure 11:
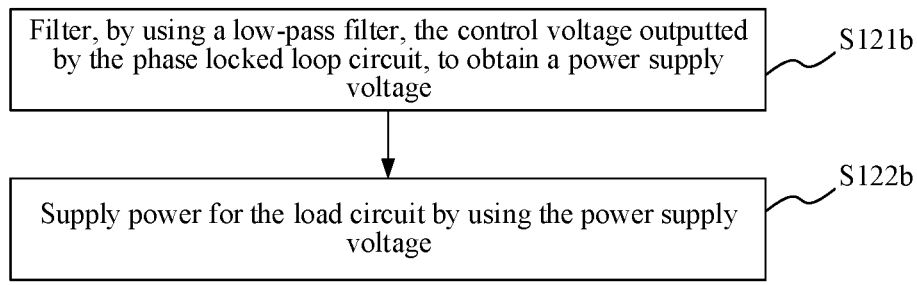
FIG. 11 is a second flowchart of operation S12 of a phase locked loop-based power supply method in a specific embodiment of the present disclosure.

Referring to FIG. 11, in an embodiment of the present disclosure, in consideration of the ripple in the control voltage of the VCO, in this embodiment, the supplying power for a load circuit by using the control voltage outputted by the phase locked loop circuit includes the following:

S121*b*, filtering, by using a low-pass filter, the control voltage outputted by the phase locked loop circuit, to obtain a power supply voltage. In this operation, high-frequency noise in the control voltage of the VCO can be filtered out by using the low-pass filter.

S122*b*, supplying power for the load circuit by using the power supply voltage.

Figure 12:
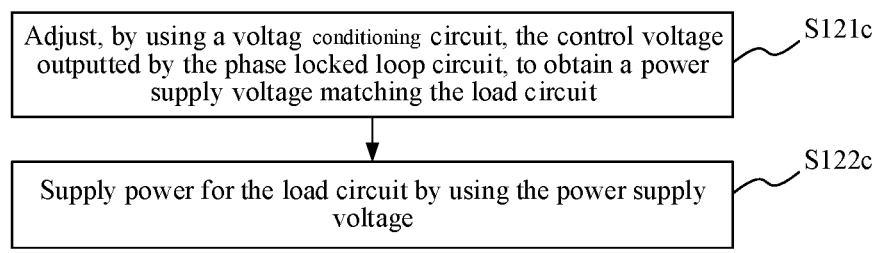
FIG. 12 is a third flowchart of operation S12 of a phase locked loop-based power supply method in a specific embodiment of the present disclosure.

In an embodiment of the present disclosure, in consideration of possible existence of a mismatch between a requirement of the load circuit 2 for the power supply voltage and the power supply voltage provided by the voltage regulator 12 in a specific application, for example, the load circuit 2 requires a voltage of 9 V, but the voltage regulator 12 can provide only a voltage of 0.9 V, such a mismatch causes difficulty of the phase locked loop-based power supply circuit 1 in supplying power for the load circuit 2. For such a problem, referring to FIG. 12, in this embodiment, an implementation of the supplying power for a load circuit by using the control voltage outputted by the phase locked loop circuit includes the following.

S121*c*, adjusting, by using a voltage conditioning circuit, the control voltage outputted by the phase locked loop circuit, to obtain a power supply voltage matching the load circuit; the voltage conditioning circuit includes an offset circuit, a scaling circuit, and/or a limiting circuit; the offset circuit includes a positive offset circuit and a negative offset circuit.

S122*c*, supplying power for the load circuit by using the power supply voltage.

Figure 13:
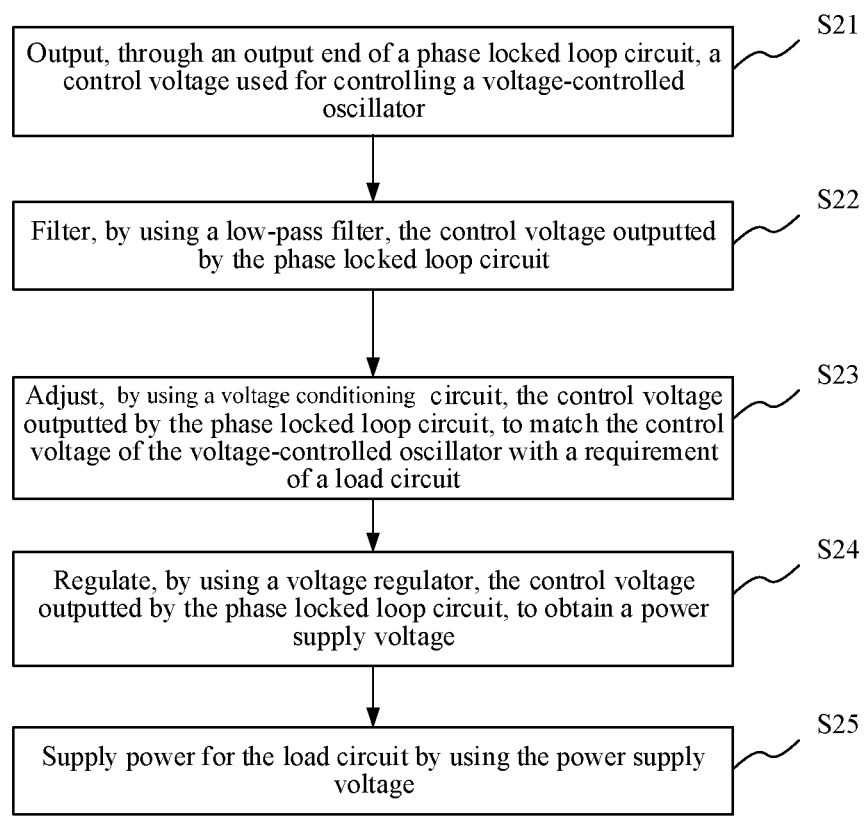
FIG. 13 is a flowchart of a phase locked loop-based power supply method in a specific embodiment of the present disclosure.

In this embodiment, an extra timing margin can be provided for the digital circuit by using the voltage conditioning circuit, to ensure the matching between the phase locked loop-based power supply circuit and the load circuit. FIG. 13 is a flowchart of a phase locked loop-based power supply method according to the present disclosure in another specific embodiment. The method may be applied to a power supply circuit including a phase locked loop circuit. For example, the method may be performed by the phase locked loop-based power supply circuit shown in FIG. 5, FIG. 6, or FIG. 7. Specifically, the phase locked loop-based power supply method includes the following:

S21, outputting, through an output end of the phase locked loop circuit, a control voltage used for controlling a VCO; preferably, the VCO is a ring oscillator, and the ring oscillator includes a plurality of CMOS inverters.

S22, filtering, by using a low-pass filter, the control voltage outputted by the phase locked loop circuit, to reduce a ripple in the control voltage outputted by the phase locked loop circuit.

S23, adjusting, by a voltage conditioning circuit, the control voltage outputted by the phase locked loop circuit, to match the control voltage of the VCO with a requirement of the load circuit. The voltage conditioning circuit includes an offset circuit, a scaling circuit, and/or a limiting circuit.

S24, regulating, by a voltage regulator, the control voltage outputted by the phase locked loop circuit, to obtain a power supply voltage. The power supply voltage may be used for supplying power for a load circuit.

S25, supplying power for the load circuit by using the power supply voltage.

The protection scope of the phase locked loop-based power supply method according to the present disclosure is not limited to the execution sequence of the operations listed in this embodiment, and all solutions implemented by adding or replacing an operation in the traditional technology according to the principle of the present disclosure fall within the protection scope of the present disclosure.

The present disclosure further provides a phase locked loop-based power supply circuit. The phase locked loop-based power supply circuit may implement the phase locked loop-based power supply method according to the present disclosure. However, an apparatus for implementing the phase locked loop-based power supply method according to the present disclosure includes, but is not limited to structures of the phase locked loop-based power supply circuit disclosed in this embodiment. Any structural deformation and replacement made according to the principle of the present disclosure fall within the protection scope of the present disclosure.

In the industry of integrated circuits, the timing of the digital circuit is optimized, and a challenge in the design of the digital circuit is timing closure in all running conditions. In some embodiments, to cover the worst case, the power supply voltage of the digital circuit is usually increased in the conventional technology, resulting in an increase of power consumption of the digital circuit. In the present disclosure, the phase locked loop-based power supply circuit outputs, by using the phase locked loop circuit, a control voltage used for controlling the VCO, and obtains a power supply voltage according to the control voltage to supply power for the load circuit. In addition, with the continuous improvement of integration, the phase locked loop has become a basic component of a large-scale integrated circuit. In a specific application, generating a clock signal having the highest frequency in the entire chip by using the phase locked loop and providing the clock signal for the digital circuit is a common means in the art. Therefore, in the present disclosure, the phase locked loop is combined with a power supply circuit, to enable the phase locked loop-based power supply circuit to reduce impact generated by interference factors, such as a temperature variation, a voltage variation, and a process corner difference, on timing of the digital circuit. This is conducive to lowering power consumption of the digital circuit. In addition, the phase locked loop-based power supply circuit according to this embodiment further includes a voltage regulator. The voltage regulator can compensate for a gap between power supply required by the load circuit and the logic gates included in the voltage regulator and the control voltage of the VCO. Given the above, the phase locked loop-based power supply circuit according to the present disclosure can reduce timing variations in the digital circuit and lower power consumption in a case that the size of a chip is not increased. The phase locked loop-based power supply circuit is an open-loop circuit, to avoid any glitches caused by the adjustment.

In conclusion, the present disclosure effectively overcomes various disadvantages in traditional technology, and has a high industrial utilization value.

The above embodiments merely exemplify the principles and effects of the present disclosure, but are not intended to limit the present disclosure. Any person skilled in the art may make modifications or changes to the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A phase locked loop-based power supply circuit, comprising:
    a phase locked loop circuit, comprising a voltage-controlled oscillator, wherein the phase locked loop circuit outputs, through an output end of the phase locked loop circuit, a control voltage used for controlling the voltage-controlled oscillator; and
    a voltage regulator, wherein an input end of the voltage regulator is connected with the output end of the phase locked loop circuit, to make the control voltage outputted by the phase locked loop circuit form a power supply voltage after passing through the voltage regulator, wherein,
    the power supply voltage is configured to supply power for a load circuit, and the load circuit comprises at least one logic gate.

2. The phase locked loop-based power supply circuit of claim 1, wherein the voltage-controlled oscillator is a ring oscillator.

3. The phase locked loop-based power supply circuit of claim 2, wherein the ring oscillator comprises a loop circuit, and a quantity of inverters in the loop circuit is greater than a threshold.

4. The phase locked loop-based power supply circuit of claim 1, wherein the phase locked loop-based power supply circuit further comprises a low-pass filter; and the output end of the phase locked loop circuit is connected with the input end of the voltage regulator through the low-pass filter.

5. The phase locked loop-based power supply circuit of claim 1, wherein:
    the phase locked loop-based power supply circuit further comprises a voltage conditioning circuit;
    the output end of the phase locked loop circuit is connected with the input end of the voltage regulator through the voltage conditioning circuit;
    the voltage conditioning circuit is configured to adjust the control voltage outputted by the phase locked loop circuit, to match the power supply voltage with the load circuit.

6. The phase locked loop-based power supply circuit of claim 5, wherein the voltage conditioning circuit comprises an offset circuit, a scaling circuit, and/or a limiting circuit.

7. A chip, comprising the phase locked loop-based power supply circuit of claim 1.

8. A phase locked loop-based power supply method, applied to a power supply circuit comprising a phase locked loop circuit, the phase locked loop circuit comprising a voltage-controlled oscillator, wherein the phase locked loop-based power supply method comprises:
    outputting, through an output end of the phase locked loop circuit, a control voltage used for controlling the voltage-controlled oscillator; and
    supplying power for a load circuit by using the control voltage outputted by the phase locked loop circuit, wherein the load circuit comprises at least one logic gate.

9. The phase locked loop-based power supply method of claim 8, wherein the voltage-controlled oscillator is a ring oscillator.

10. The phase locked loop-based power supply method of claim 9, wherein the ring oscillator comprises a loop circuit, and a quantity of inverters in the loop circuit is greater than a threshold.

11. The phase locked loop-based power supply method of claim 8, wherein the supplying power for a load circuit by using the control voltage outputted by the phase locked loop circuit comprises:
- regulating, by using a voltage regulator, the control voltage outputted by the phase locked loop circuit, to obtain a power supply voltage; and
- supplying power for the load circuit by using the power supply voltage.

12. The phase locked loop-based power supply method of claim 8, wherein the supplying power for a load circuit by using the control voltage outputted by the phase locked loop circuit comprises:
- filtering, by using a low-pass filter, the control voltage outputted by the phase locked loop circuit, to obtain a power supply voltage; and
- supplying power for the load circuit by using the power supply voltage.

13. The phase locked loop-based power supply method of claim 8, wherein the supplying power for a load circuit by using the control voltage outputted by the phase locked loop circuit comprises:
- adjusting, by using a voltage conditioning circuit, the control voltage outputted by the phase locked loop circuit, to obtain a power supply voltage matching the load circuit; and
- supplying power for the load circuit by using the power supply voltage.

14. The phase locked loop-based power supply method of claim 13, wherein the voltage conditioning circuit comprises an offset circuit, a scaling circuit, and/or a limiting circuit.

\* \* \* \* \*